(12) United States Patent
Guo et al.

(10) Patent No.: US 8,927,432 B2
(45) Date of Patent: Jan. 6, 2015

(54) CONTINUOUSLY SCALABLE WIDTH AND HEIGHT SEMICONDUCTOR FINS

(75) Inventors: Dechao Guo, Fishkill, NY (US); Yang Liu, Wappingers Falls, NY (US); Chengwen Pei, Danbury, CT (US); Yue Tan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 13/523,048

(22) Filed: Jun. 14, 2012

(65) Prior Publication Data

US 2013/0334602 A1 Dec. 19, 2013

(51) Int. Cl.
*H01L 29/772* (2006.01)
*H01L 21/336* (2006.01)

(52) U.S. Cl.
USPC .......... 438/696; 257/347; 438/157; 438/479; 438/510

(58) Field of Classification Search
CPC ............ H01L 21/823431; H01L 21/845; H01L 27/1211; H01L 29/66795; H01L 29/66803; H01L 29/785
USPC ............ 257/328, 401; 438/156, 157, 696
See application file for complete search history.

(56) References Cited

U.S. PATENT DOCUMENTS

| | | | |
|---|---|---|---|
| 6,855,588 B1 | 2/2005 | Liao et al. | |
| 7,709,303 B2 | 5/2010 | Burnett et al. | |
| 7,851,276 B2 | 12/2010 | Yang et al. | |
| 7,888,192 B2 | 2/2011 | Marshall et al. | |
| 7,888,750 B2 * | 2/2011 | Anderson et al. | 257/401 |
| 7,902,035 B2 | 3/2011 | Yu et al. | |
| 7,956,669 B2 | 6/2011 | Chuang et al. | |
| 8,084,309 B2 | 12/2011 | Cheng et al. | |
| 8,101,994 B2 | 1/2012 | Yu et al. | |
| 2003/0067017 A1* | 4/2003 | Ieong et al. | 257/206 |
| 2004/0222477 A1* | 11/2004 | Aller et al. | 257/412 |
| 2005/0001273 A1* | 1/2005 | Bryant et al. | 257/369 |
| 2005/0153562 A1* | 7/2005 | Furukawa et al. | 438/694 |
| 2006/0154426 A1* | 7/2006 | Anderson et al. | 438/300 |
| 2007/0108528 A1 | 5/2007 | Anderson et al. | |
| 2007/0170521 A1* | 7/2007 | Abadeer et al. | 257/401 |
| 2007/0218628 A1* | 9/2007 | Orlowski et al. | 438/254 |
| 2008/0124868 A1* | 5/2008 | Nowak | 438/268 |

(Continued)

FOREIGN PATENT DOCUMENTS

EP 0511777 B1 9/1994

*Primary Examiner* — Khiem D Nguyen
*Assistant Examiner* — Pauline Vu
(74) *Attorney, Agent, or Firm* — Scully, Scott, Murphy & Presser, P.C.; Joseph P. Abate, Esq.

(57) ABSTRACT

Arbitrarily and continuously scalable on-currents can be provided for fin field effect transistors by providing two independent variables for physical dimensions for semiconductor fins that are employed for the fin field effect transistors. A recessed region is formed on a semiconductor layer over a buried insulator layer. A dielectric cap layer is formed over the semiconductor layer. Disposable mandrel structures are formed over the dielectric cap layer and spacer structures are formed around the disposable mandrel structures. Selected spacer structures can be structurally damaged during a masked ion implantation. An etch is employed to remove structurally damaged spacer structures at a greater etch rate than undamaged spacer structures. After removal of the disposable mandrel structures, the semiconductor layer is patterned into a plurality of semiconductor fins having different heights and/or different width. Fin field effect transistors having different widths and/or heights can be subsequently formed.

9 Claims, 15 Drawing Sheets

(56) References Cited

U.S. PATENT DOCUMENTS

| | | |
|---|---|---|
| 2008/0128797 A1 | 6/2008 | Dyer et al. |
| 2008/0258207 A1* | 10/2008 | Radosavljevic et al. ...... 257/327 |
| 2009/0032859 A1* | 2/2009 | Zhu .............................. 257/316 |
| 2010/0203732 A1* | 8/2010 | Doris et al. ................... 438/694 |
| 2010/0248481 A1* | 9/2010 | Schultz ........................ 438/694 |
| 2011/0021010 A1* | 1/2011 | Cheng et al. .................. 438/513 |
| 2011/0057258 A1 | 3/2011 | Anderson et al. |
| 2011/0101455 A1* | 5/2011 | Basker et al. ................. 257/347 |

\* cited by examiner

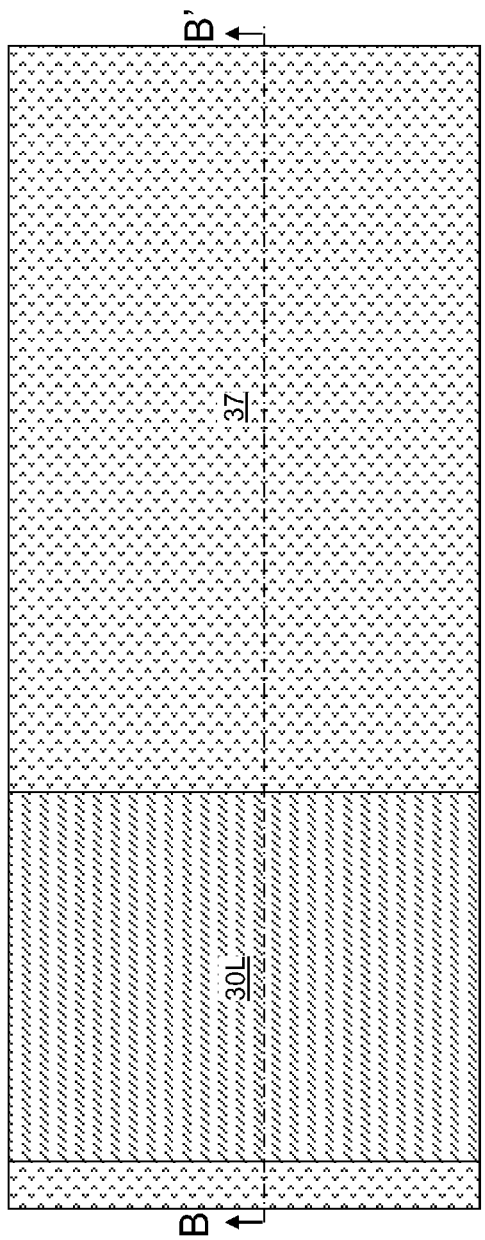
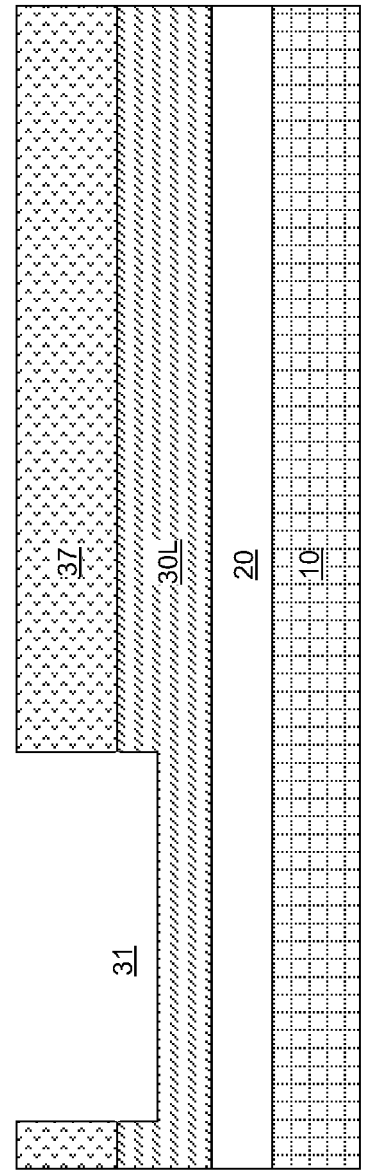
FIG. 1A
FIG. 1B

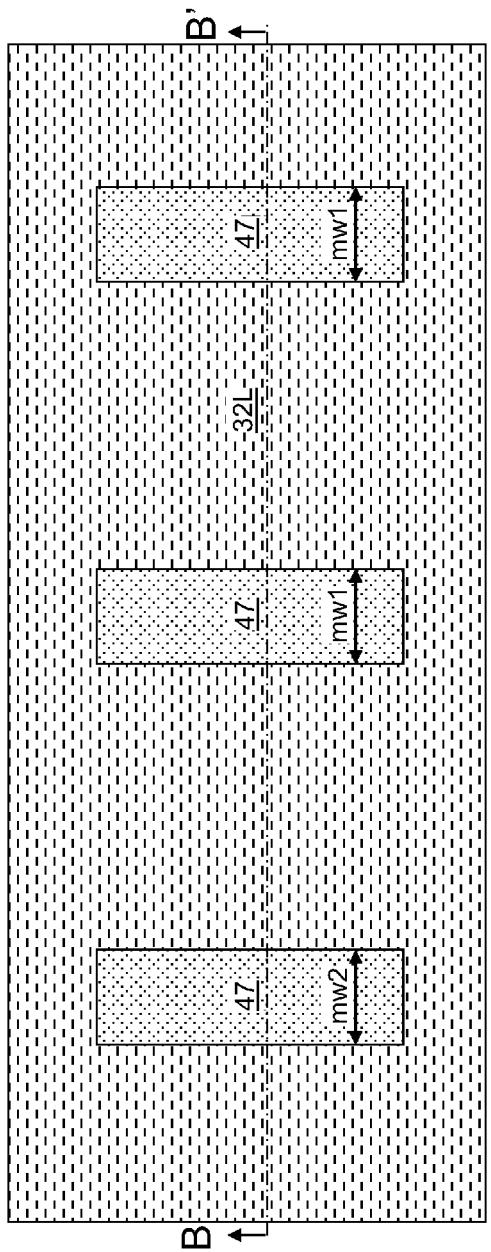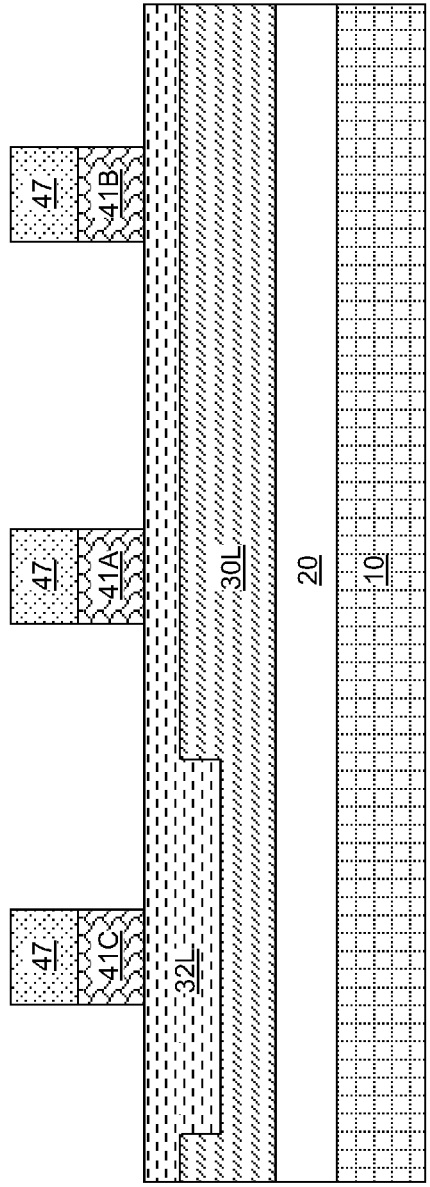

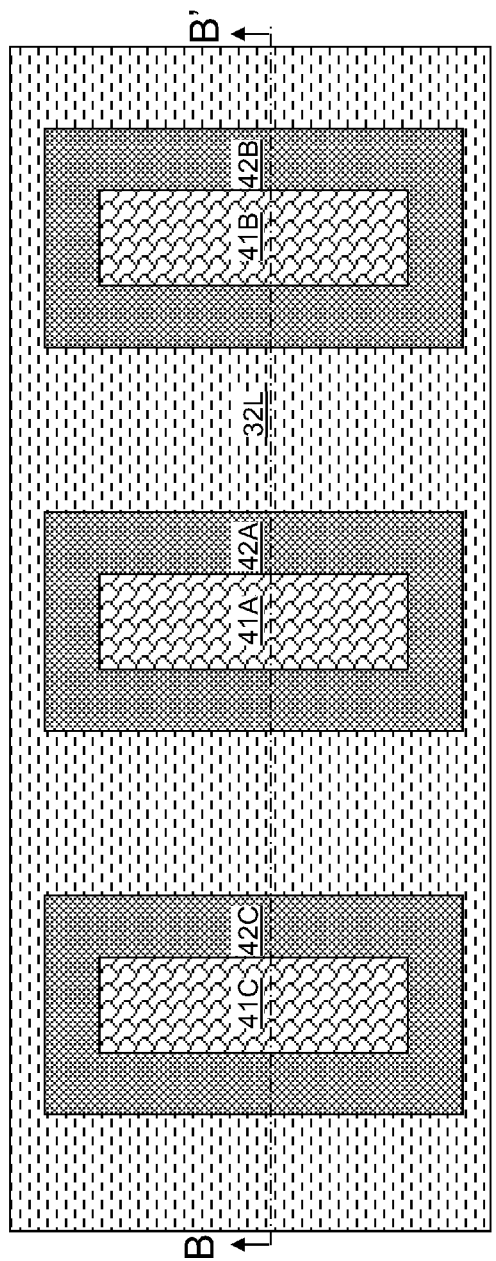
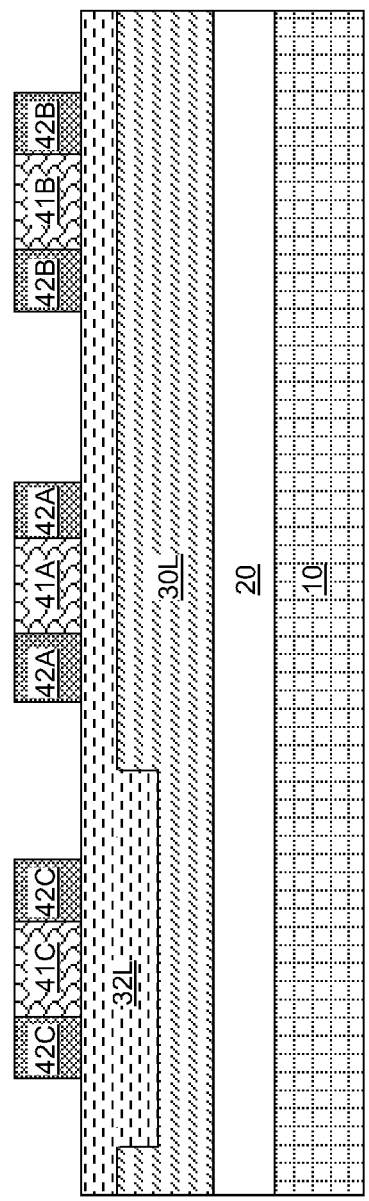
FIG. 3A
FIG. 3B

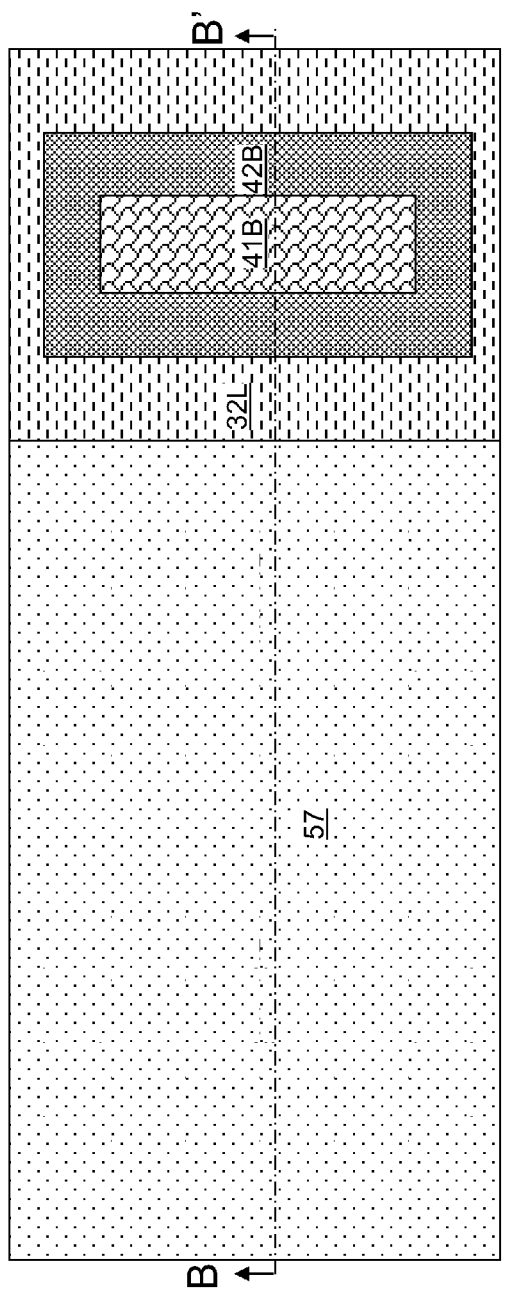
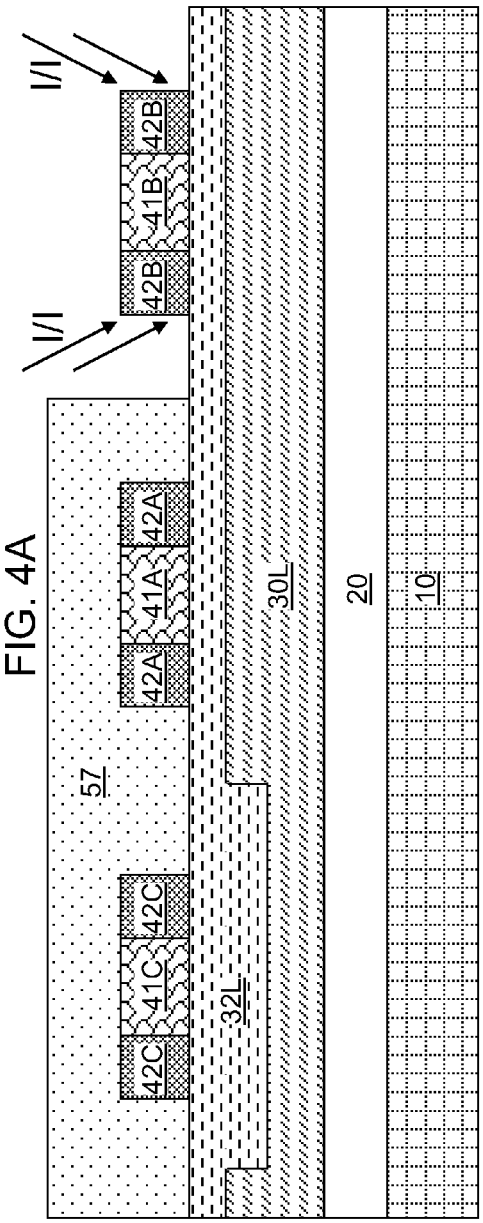
FIG. 4A
FIG. 4B

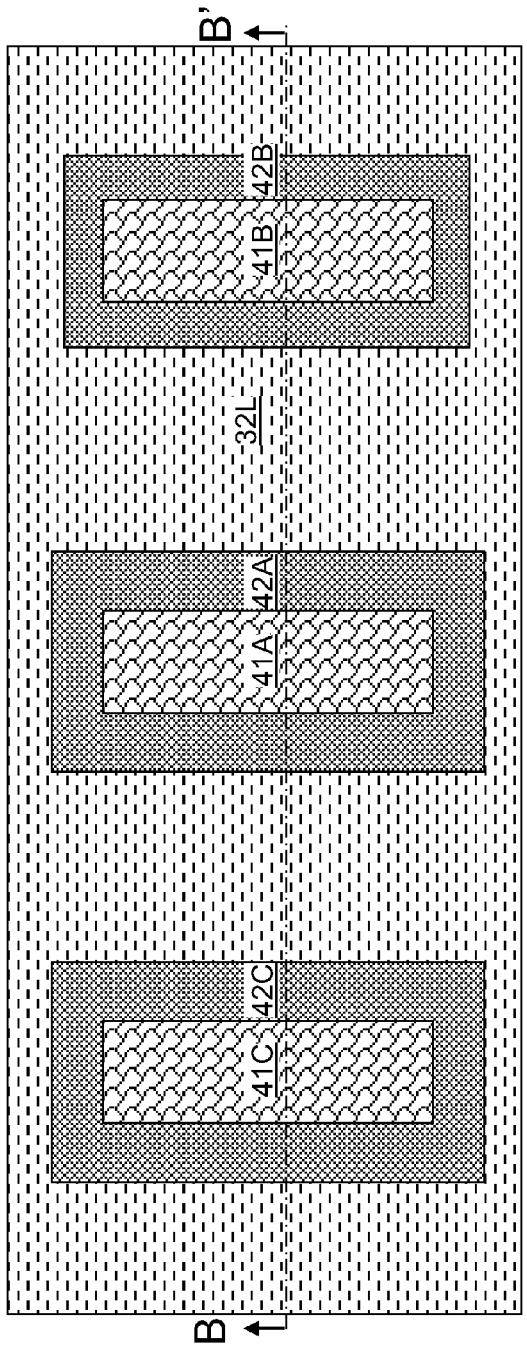
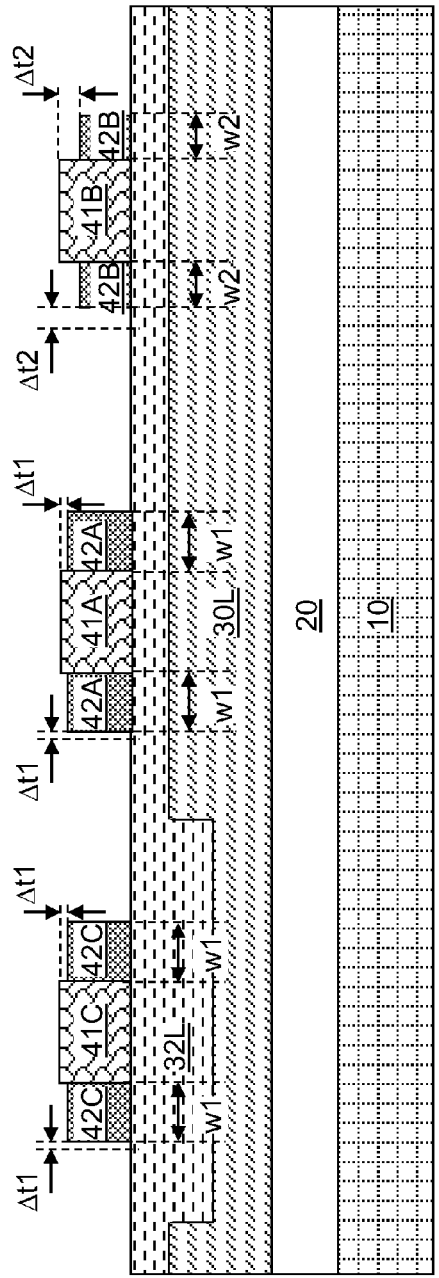
FIG. 5A
FIG. 5B

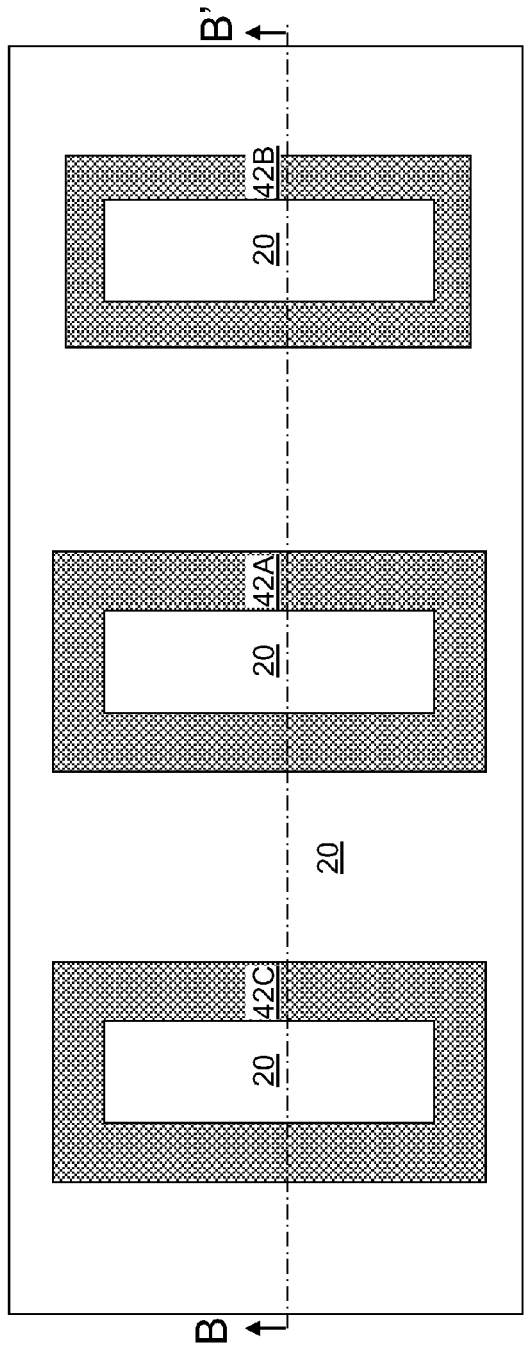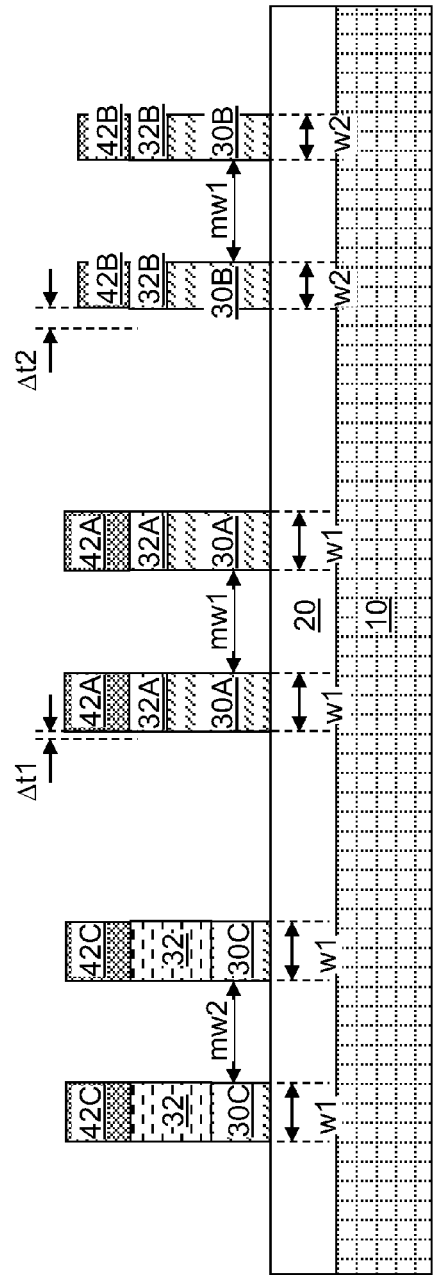
FIG. 7A
FIG. 7B

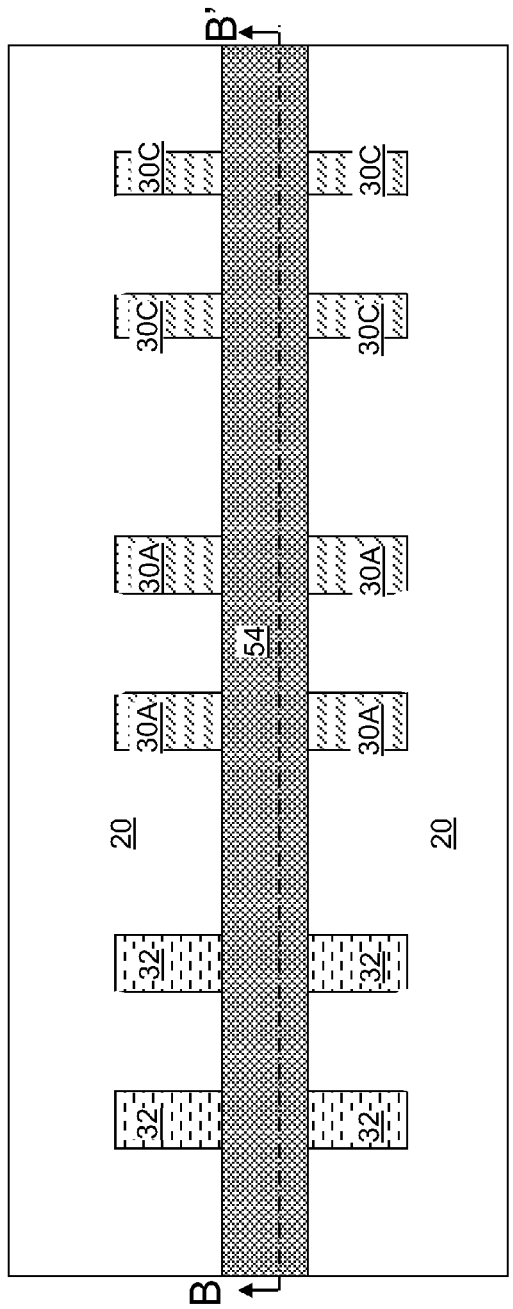
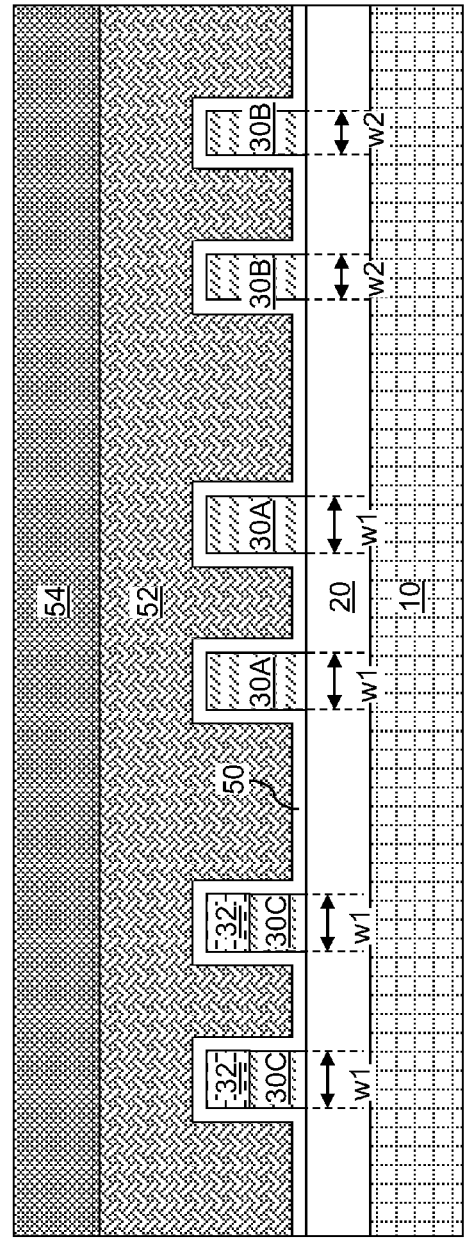
FIG. 10A
FIG. 10B

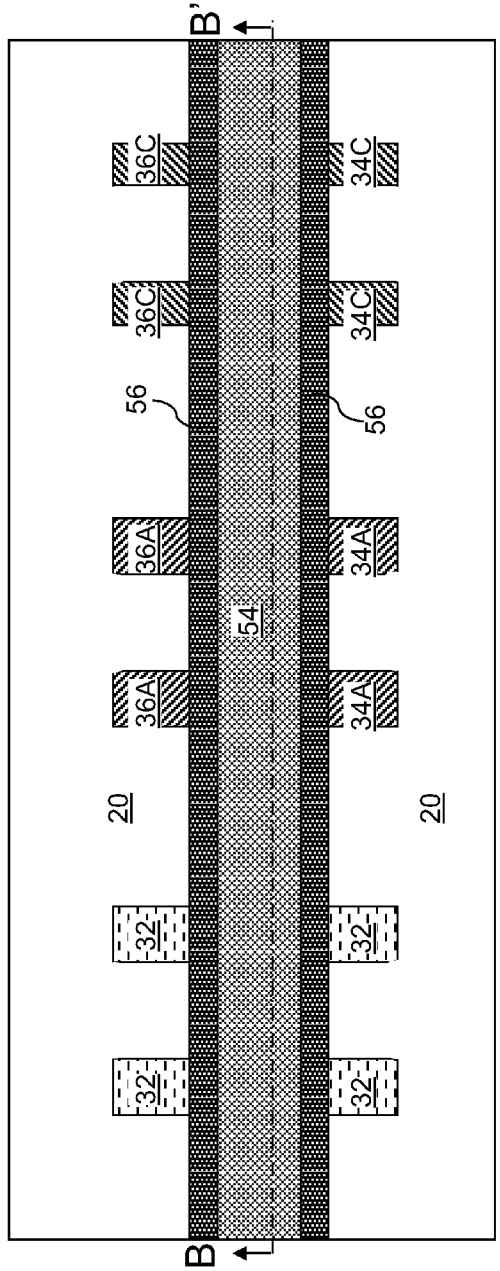
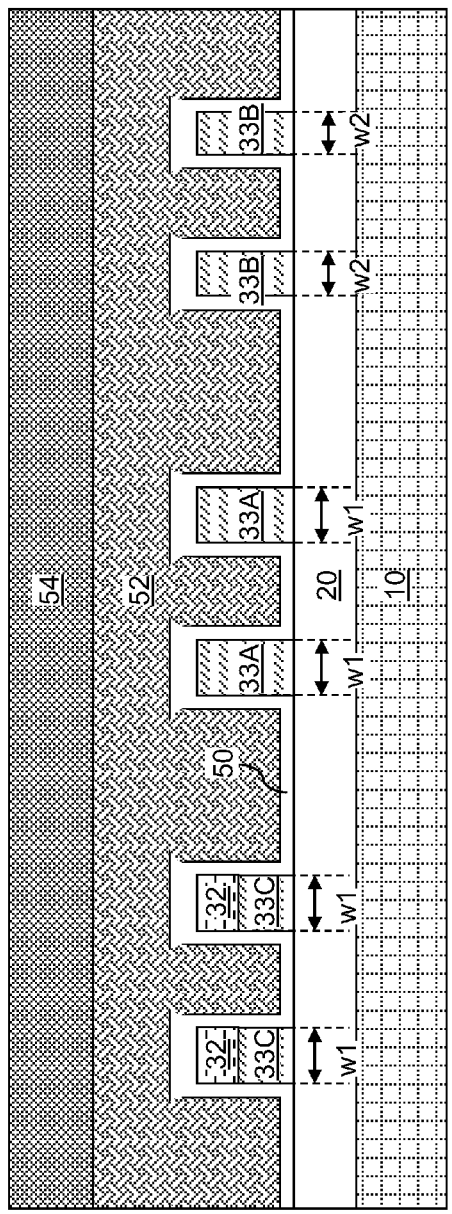
FIG. 11A
FIG. 11B

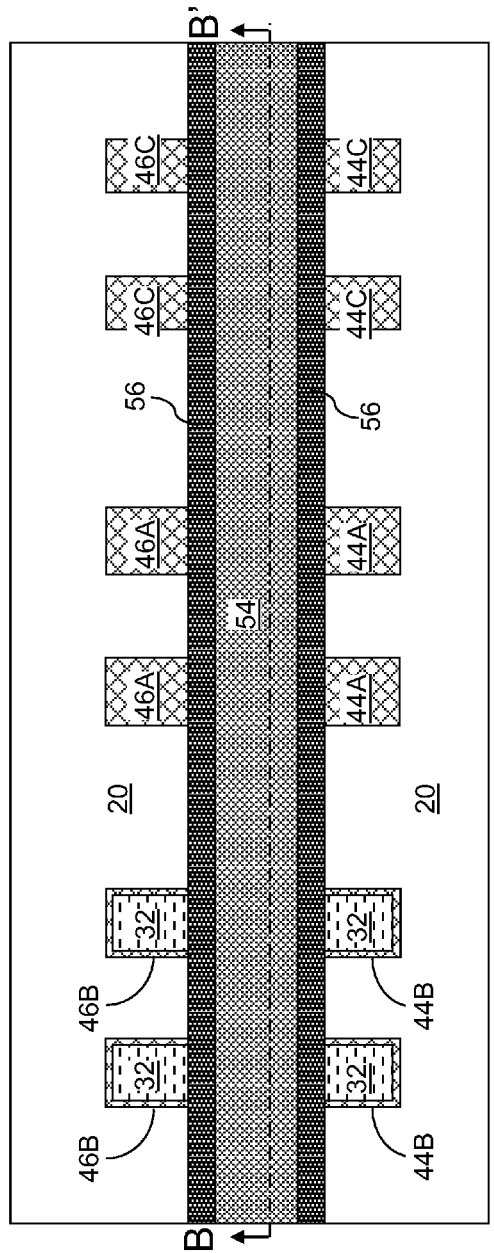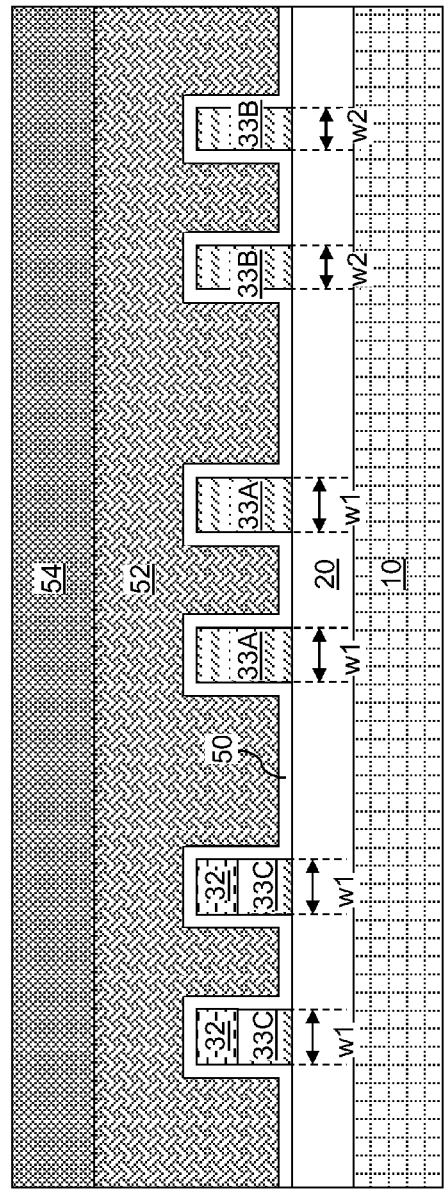

CONTINUOUSLY SCALABLE WIDTH AND HEIGHT SEMICONDUCTOR FINS

BACKGROUND

The present disclosure relates to a semiconductor structure, and more particularly to a semiconductor structure including semiconductor fins having a continuously scalable width and/or a continuously scalable height, and a method of manufacturing the same.

The on-current of conventional fin field effect transistors can be scaled only in integer multiples of a unit on-current, which corresponds to the on-current of a single semiconductor fin. Specifically, a fin field effect transistor includes one or more semiconductor fins having a same height and width. The total number of semiconductor fins included in the field effect transistor determines the on-current of the conventional fin field effect transistors.

However, non-integer fractions may be preferred between on-currents of many types of circuits. For example, optimal numbers for the ratios among on-currents of various transistors in a static random access circuit (commonly known as beta and gamma) are non-integers. Thus, the discrete nature on the on-current of conventional fin field effect transistors imposes limitations on the circuit design.

BRIEF SUMMARY

Arbitrarily and continuously scalable on-currents can be provided for fin field effect transistors by providing two independent variables for physical dimensions for semiconductor fins that are employed for the fin field effect transistors. A recessed region is formed on a semiconductor layer over a buried insulator layer. A dielectric cap layer is formed over the semiconductor layer. Disposable mandrel structures are formed over the dielectric cap layer and spacer structures are formed around the disposable mandrel structures. Selected spacer structures can be structurally damaged during a masked ion implantation. An etch is employed to remove structurally damaged spacer structures at a greater etch rate than undamaged spacer structures. After removal of the disposable mandrel structures, the semiconductor layer is patterned into a plurality of semiconductor fins having different heights and/or different width by an etch that employs the remaining portions of the spacer structures as an etch mask. Fin field effect transistors having different widths and/or heights can be subsequently formed.

According to an aspect of the present disclosure, a method of forming a semiconductor structure is provided. At least a first disposable mandrel structure and a second disposable mandrel structure are formed over a stack of a buried insulator layer, a semiconductor material layer, and a dielectric cap layer. A first spacer structure including a spacer material is formed around the first disposable mandrel structure, and a second spacer structure including the spacer material is formed around the second disposable mandrel structure. At least one dopant material is implanted into the second spacer structure to convert the spacer material into a doped spacer material within the second spacer structure, while the at least one dopant material is not implanted into the first spacer structure. Physically exposed portions of the first spacer structure and the second spacer structure are etched employing an etch chemistry that provides a greater etch rate for the doped spacer material than the spacer material. Subsequently, the first and second disposable mandrel structures are removed. At least a first semiconductor fin and a second semiconductor fin can be formed by transferring a pattern of remaining portions of the first spacer structure and the second structure after the etching into the semiconductor material layer by an anisotropic etch.

According to another aspect of the present disclosure, a semiconductor structure is provided, which includes a first semiconductor fin having a first height and a first width and located on an insulator layer, and a second semiconductor fin having the first height and a second width that is less than the first width and located on the insulator layer. Additionally, the semiconductor structure can include a vertical stack of a third semiconductor fin and a dielectric cap portion located on the insulator layer. The third semiconductor fin can have a second height that is less than the first height.

BRIEF DESCRIPTION OF SEVERAL VIEWS OF THE DRAWINGS

FIG. 1A is a top-down view of a first exemplary semiconductor structure after recessing a portion of a semiconductor material layer, which is a top semiconductor layer of a semiconductor-on-insulator (SOI) substrate, according to an embodiment of the present disclosure.

FIG. 1B is a vertical cross-sectional view of the first exemplary semiconductor structure along the vertical plane B-B' of FIG. 1A.

FIG. 2A is a top-down view of the first exemplary semiconductor structure after formation of a dielectric cap layer and disposable mandrel structures according to an embodiment of the present disclosure.

FIG. 2B is a vertical cross-sectional view of the first exemplary semiconductor structure along the vertical plane B-B' of FIG. 2A.

FIG. 3A is a top-down view of the first exemplary semiconductor structure after formation of spacer structures according to an embodiment of the present disclosure.

FIG. 3B is a vertical cross-sectional view of the first exemplary semiconductor structure along the vertical plane B-B' of FIG. 3A.

FIG. 4A is a top-down view of the first exemplary semiconductor structure during masked implantation of at least one dopant material according to an embodiment of the present disclosure.

FIG. 4B is a vertical cross-sectional view of the first exemplary semiconductor structure along the vertical plane B-B' of FIG. 4A.

FIG. 5A is a top-down view of the first exemplary semiconductor structure after differential etching of spacer structures according to an embodiment of the present disclosure.

FIG. 5B is a vertical cross-sectional view of the first exemplary semiconductor structure along the vertical plane B-B' of FIG. 5A.

FIG. 7A is a top-down view of the first exemplary semiconductor structure after formation of semiconductor fins according to an embodiment of the present disclosure.

FIG. 7B is a vertical cross-sectional view of the first exemplary semiconductor structure along the vertical plane B-B' of FIG. 7A.

FIG. 10A is a top-down view of the first exemplary semiconductor structure after formation of a gate electrode and a gate cap dielectric portion according to an embodiment of the present disclosure.

FIG. 10B is a vertical cross-sectional view of the first exemplary semiconductor structure along the vertical plane B-B' of FIG. 10A.

FIG. 11A is a top-down view of the first exemplary semiconductor structure after formation of source and drain regions according to an embodiment of the present disclosure.

FIG. 11B is a vertical cross-sectional view of the first exemplary semiconductor structure along the vertical plane B-B' of FIG. 11A.

FIG. 12A is a top-down view of the first exemplary semiconductor structure after formation of metal semiconductor alloy portions according to an embodiment of the present disclosure.

FIG. 12B is a vertical cross-sectional view of the first exemplary semiconductor structure along the vertical plane B-B' of FIG. 12A.

DETAILED DESCRIPTION

Figure 6A:
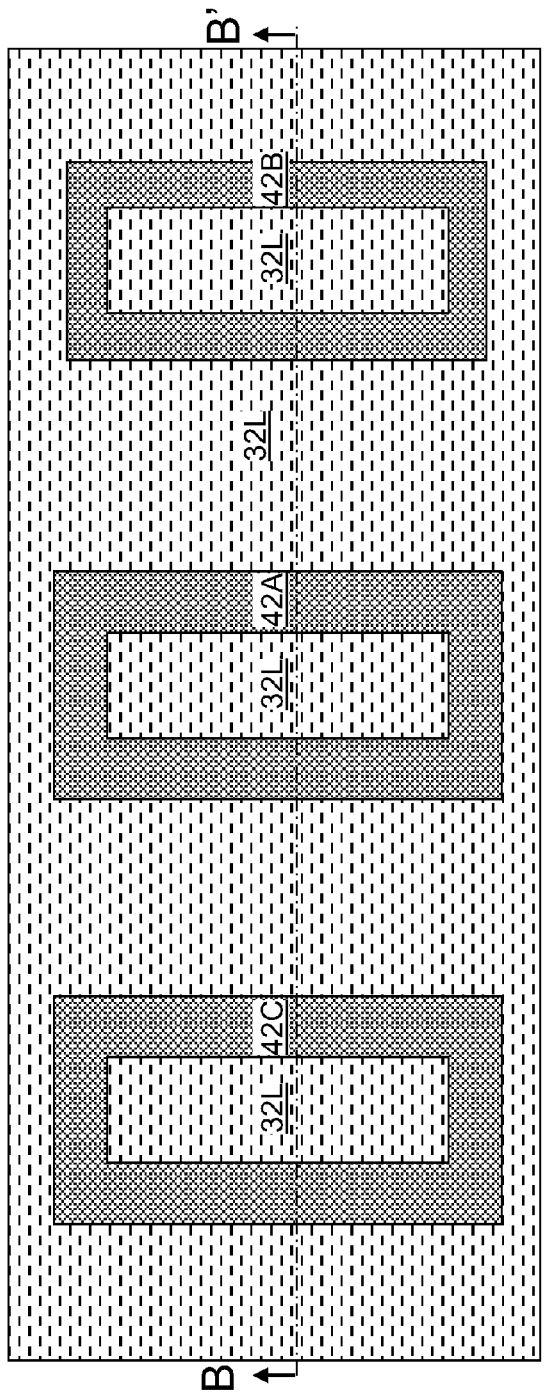
FIG. 6A is a top-down view of the first exemplary semiconductor structure after removal of the disposable mandrel structures according to an embodiment of the present disclosure.

As stated above, the present disclosure relates to a semiconductor structure including semiconductor fins having a continuously scalable width and/or a continuously scalable height, and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A and 1B, a first exemplary semiconductor structure according to an embodiment of the present disclosure can be formed by providing a semiconductor-on-insulator (SOI) substrate. The SOI substrate can include, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 includes a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L is a semiconductor material layer. The semiconductor material of the top semiconductor layer 30L can be an elemental semiconductor material or a compound semiconductor material. For example, the semiconductor material can be silicon, germanium, a silicon-germanium alloy, or a silicon-carbon alloy. The semiconductor material may, or may not, be doped with p-type dopants and/or n-type dopants. The semiconductor material can be a single crystalline semiconductor material, a polycrystalline semiconductor material, or an amorphous semiconductor material. In one embodiment, the semiconductor material can be silicon. In one embodiment, the semiconductor material can be single crystalline silicon. The thickness of the top semiconductor layer 30L can be from 10 nm to 500 nm, although lesser and greater thicknesses can also be employed.

A photoresist layer 37 is applied over the top semiconductor layer 30L, and is subsequently patterned by lithographic methods. Specifically, an opening is formed in the photoresist layer 37 above a region of the top semiconductor layer 30L by lithographic exposure and development. The pattern in the photoresist layer 37 is transferred into an upper portion of the top semiconductor layer 30L by an etch that employs the photoresist layer 37 as an etch mask. The etch can be an anisotropic etch such as a reactive ion etch, or an isotropic etch such as a wet etch.

The portion of the top semiconductor layer 30L underneath the opening in the photoresist layer 37 is recessed during the etch. A recess cavity 31 is formed in an upper portion of the top semiconductor layer 30L. The photoresist layer 37 is subsequently removed selective to the top semiconductor layer 30L, for example, by ashing. The recess depth, i.e., the depth of the recess cavity 31 as measured from the topmost surface of the top semiconductor layer 30L, is continuously scalable.

Referring to FIGS. 2A and 2B, a dielectric cap layer 32L can be formed over the top semiconductor layer 32L. The dielectric cap layer 32L includes a dielectric material such as silicon oxide, silicon nitride, silicon oxynitride, or a combination thereof. The dielectric cap layer 32L can be deposited, for example, by chemical vapor deposition (CVD). The dielectric cap layer can be deposited over the recessed portion of the top semiconductor layer 30L and over the unrecessed portion of the top semiconductor layer 30L. The thickness of the dielectric cap layer 32L as deposited is selected such that the entirety of the recess cavity 31 is filled with the deposited dielectric material of the dielectric cap layer 32L.

The dielectric cap layer 32L can be subsequently planarized, for example, by chemical mechanical planarization. In one embodiment, the planarized dielectric cap layer 32L can have a planar top surface that is vertically spaced from the topmost surface of the top semiconductor layer 30L. In another embodiment, the top surface of the planarized dielectric cap layer 32L can be coplanar with the topmost surface of the top semiconductor layer 30L, i.e., the dielectric cap layer 32L can be laterally confined within the extent of the recess cavity 31, and not present over the topmost surface of the top semiconductor layer 30L.

A disposable mandrel layer (not shown) can be deposited over the top semiconductor layer 30L and the dielectric cap layer 32L, and is subsequently patterned by a combination of lithographic methods and an etch to form various disposable mandrel structures. If the dielectric cap layer 32L is present over the entirety of the top semiconductor layer 30L, the disposable mandrel layer includes a material that is different from the material of the dielectric cap layer 32L. If the lateral extent of the dielectric cap layer 32L is confined within the recess cavity 31 (See FIGS. 2A and 2B), the disposable mandrel layer includes a material that is different from the material of the dielectric cap layer 32L and different from the material of the top semiconductor layer. The disposable mandrel layer is deposited as a blanket layer having the same thickness throughout.

For example, the disposable mandrel layer can include a semiconductor material, amorphous carbon, a dielectric material that is different from the dielectric material of the dielectric cap layer 32L, or a metallic material. In one embodiment, the disposable mandrel layer can include germanium, a silicon germanium alloy, amorphous carbon, or organosilicate glass (OSG). A photoresist layer 47 is applied over the disposable mandrel layer, and is lithographically patterned with a pattern that includes a plurality of discrete shapes. In one embodiment, the plurality of discrete shapes can include at least one first rectangle having a first mandrel width mw1 and at least one second rectangle having a second mandrel width mw2.

The pattern in the photoresist layer 47 can be transferred into the disposable mandrel layer by an anisotropic etch that employs the photoresist layer 47 as a masking layer. The disposable mandrel layer is patterned into a plurality of disposable mandrel structures. The plurality of disposable mandrel structure can include, for example, a first disposable mandrel structure 41A, a second disposable mandrel structure 41B, and a third disposable mandrel structure 41C.

Referring to FIGS. 3A and 3B, spacer structures (42A, 42B, 42C) are formed on sidewalls of the disposable mandrel structures (41A, 41B, 41C). The spacer structures (42A, 42B, 42C) include a spacer material that is different from the materials of the disposable mandrel structures (41A, 41B, 41C) and the top semiconductor layer 30L. In one embodiment, the spacer material can be a dielectric material selected from silicon nitride, silicon oxide, silicon oxynitride, and dielectric metal oxide such as $HfO_2$, $ZrO_2$, and $La_2O_3$. In one embodiment, the spacer material can be different form the material of the dielectric cap layer 32L. In one embodiment, the dielectric cap layer 32L can include silicon oxide, and the spacer material can be silicon nitride.

The spacer structures (42A, 42B, 42C) can be formed by depositing a continuous layer of the spacer material, for example, by chemical vapor deposition (CVD). Subsequently, horizontal portions of the continuous layer can be removed by an anisotropic etch. Remaining portions of the continuous layer constitute the spacer structures (42A, 42B, 42C).

The spacer structures (42A, 42B, 42C) can include, for example, a first spacer structure that is formed around the first disposable mandrel structure 41A, a second spacer structure that is formed around the second disposable mandrel structure 41B, and a third spacer structure that is formed around the third disposable mandrel structure 41C.

The various spacer structures (42A, 42B, 42C) can have the same width, which is measured at the base of each spacer structure (42A, 42B, 42C) that contacts the dielectric cap layer 32L or the top semiconductor layer 30L. The width of the various spacer structures (42A, 42B, 42C) upon formation is herein referred to as an initial spacer width. The initial spacer width can be from 5 nm to 100 nm, although lesser and greater widths can also be employed.

Referring to FIGS. 4A and 4B, a patterned implantation mask layer 57 is formed over a first set of spacer structures, while a second set of spacer structures is physically exposed, i.e., not covered by the patterned implantation mask layer 57. In one embodiment, the patterned implantation mask layer 57 can be a photoresist layer that is lithographically patterned. For example, the first set of spacer structures can include the first spacer structure 42A and the third spacer structure 42C, and the second set of spacer structures can include the second spacer structure 42B.

At least one dopant material that can cause structural damage to the material of the spacer structures (42A, 42B, 42C) are implanted into the second set of spacer structures (e.g., the second spacer structure 42B) by ion implantation. The energy and species of the ion implantation and the thickness of the patterned implantation mask layer 57 are selected such that the ions are not implanted into the first set of spacer structures (e.g., the first spacer structure 41A and the third spacer structure 41C).

The at least one dopant material that can be employed for the masked ion implantation can include an electrical dopant such as P, As, Sb, and B, and/or an inert element such as Ar and Xe, and/or a semiconductor element such as Ge, C, and Si.

The implantation of the at least one dopant material into the second set of spacer structures (e.g., the second spacer structure 42B) converts the spacer material of the second set of spacer structures into a doped spacer material. The at least one dopant material is not implanted within the first set of spacer structures (e.g., the first spacer structure 41A and the third spacer structure 41C). The patterned implantation mask layer 57 is removed, for example, by ashing.

Referring to FIGS. 5A and 5B, physically exposed portions of the various spacer structures (42A, 42B, 42C) can be etched employing an etch chemistry that provides different etch rates depending on the structural damage caused by the at least one dopant material and/or depending on the concentration of the at least one dopant within the spacer material. Specifically, the etch chemistry can be selected such that the etch provides a greater etch rate for the doped spacer material of the second set of spacer structures (e.g., the second spacer structure 42B) than the undoped spacer material of the first set of spacer structures (e.g., the first spacer structure 41A and the third spacer structure 41C).

After the etch is performed, the first set of spacer structures and the second set of spacer structures have different widths. For example, the thickness of the etched undoped spacer material of the first spacer structure 42A and the third spacer structure 42C can be a first etch thickness $\Delta t1$, and the thickness of the etched doped spacer material of the second spacer structure 42B can be a second etch thickness $\Delta t2$ that is greater than the first etch thickness $\Delta t1$. In one embodiment, the ratio of the second etch thickness $\Delta t2$ to the first etch thickness $\Delta t1$ can be greater than 2.0. In another embodiment, the ratio of the second etch thickness $\Delta t2$ to the first etch thickness $\Delta t1$ can be greater than 4.0. In yet another embodiment, the ratio of the second etch thickness $\Delta t2$ to the first etch thickness $\Delta t1$ can be greater than 10.0.

The width of the spacer structures within the first set of spacer structures is herein referred to as a first width w1. The width of the spacer structures within the second set of spacer structures is herein referred to as a second width w2. For example, the first spacer structure 42A and the third spacer structure 42C can have the first width w1, and the second spacer structure 42B can have the second width w2. The first width w1 is the same as the difference between the initial spacer thickness and the first etch thickness $\Delta t1$. The second width w2 is the same as the difference between the initial spacer thickness and the second etch thickness $\Delta t2$. In one embodiment, the difference between a first height of the first spacer structure 42A and a second height of the second spacer structure 42B can be the same as the difference between the first width w1 and the second width w2. The difference between the first width w1 and the second width w2 is continuously scalable by adjusting the dose of the at least one dopant material and/or by adjusting the duration of the etch that removes the physically exposed portions of the various spacer structures (42A, 42B, 42C).

In one embodiment, the undoped spacer material can be silicon nitride, and the at least one dopant material can include phosphorus. In this case, the etch that provides differential etch rates can be a wet etch that employs hot phosphoric acid. Any other combinations of at least one dopant material and an etch that provides a structural-damage dependent etch rate and/or dopant-concentration-dependent etch rate can also be employed to provide spacer structures having different widths.

Figure 6B:
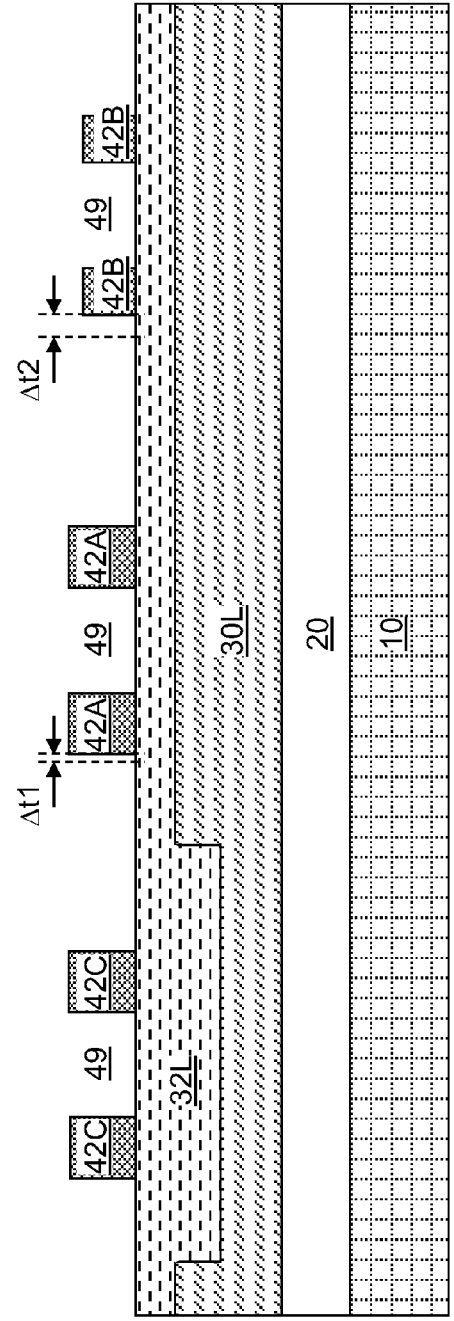
FIG. 6B is a vertical cross-sectional view of the first exemplary semiconductor structure along the vertical plane B-B' of FIG. 6A.

Referring to FIGS. 6A and 6B, the disposable mandrel structures (41A, 41B, 41C) can be removed selective to the various spacer structures (42A, 42B, 42C). For example, if the disposable mandrel structures (41A, 41B, 41C) include germanium or a germanium-containing alloy, a hot hydrogen peroxide etch can be employed to remove the disposable mandrel structures (41A, 41B, 41C). For example, the hot hydrogen peroxide etch can include 30% hydrogen peroxide in water that is heated to about 90° C. Alternately, SC-1 etch solution containing a mix of $NH_4OH$, $H_2O_2$, and $H_2O$ heated to a temperature of about 75° C. can be employed to etch the disposable mandrel structures (41A, 41B, 41C) if the disposable mandrel structures (41A, 41B, 41C) includes germanium or a germanium-containing alloy. If the disposable mandrel structures (41A, 41B, 41C) includes other materials, an etch chemistry can be employed that removes the disposable mandrel structures (41A, 41B, 41C) selective to the various spacer structures (42A, 42B, 42C) and the dielectric cap layer 32L (and selective to the top semiconductor layer 30L if the dielectric cap layer 32L does not contact the topmost surface of the top semiconductor layer 30L).

Referring to FIGS. 7A and 7B, the pattern of the various spacer structures (42A, 42B, 42C) can be transferred into the stack of the top semiconductor layer 30L and the dielectric cap layer 32L to form various fin structures. The transfer of the pattern of the various spacer structures (42A, 42B, 42C) can be effected by an anisotropic etch that removes the materials of the stack of the top semiconductor layer 30L and the dielectric cap layer 32L selective to the material of the various spacer structures (42A, 42B, 42C).

A first stack of a first semiconductor fin 30A and a first dielectric cap portion 32A can be formed underneath the first spacer structure 42A. A second stack of a second semiconductor fin 30B and a second dielectric cap portion 32B can be formed underneath the second spacer structure 42B. A third stack of a third semiconductor fin 30C and a dielectric cap portion 32 can be formed underneath the third spacer structure 42C. The first stack (30A, 32A) can have the same thickness as the first spacer structure 42A, i.e., the first width w1. The second stack (30B, 32B) can have the same thickness as the second spacer structure 42B, i.e., the second width w2. The third stack (30C, 32) can have the same thickness as the third spacer structure 42C, i.e., the first width w1.

Thus, the first semiconductor fin 30A can be formed with the first width w1, and the second semiconductor fin 30B can be formed with the second width w2 that is less than the first width w1. The third semiconductor fin 30C can be formed by transferring the pattern of the third spacer structure 42C that overlies the recessed portion of the top semiconductor layer 30L (See FIG. 6B) into the recessed portion of the top semiconductor layer 30L by the anisotropic etch.

The first dielectric cap portion 32A is in contact with the top surface of the first semiconductor fin 30A, and the second dielectric cap portion 32B is in contact with the top surface of the second semiconductor fin 30B. The topmost surface of the dielectric cap portion 32 within the third stack (30C, 32) is coplanar with the topmost surface of the first dielectric cap portion 32A and the topmost surface of the second dielectric cap portion 32B. The first spacer structure 42A is in contact with the topmost surface of the first dielectric cap portion 32A, and the second spacer structure 42B is in contact with the topmost surface of the second dielectric cap portion 32B. The first spacer structure 42A and the third spacer structure 42C include the same dielectric material, and the second spacer structure 42B includes the dielectric material of the first and third spacer structures (42A, 42C) and the at least one dopant material. The at least one dopant material is not present within the first spacer structure 42A and the third spacer structure 42C. The difference between the first height of the first spacer structure 42A and the second height of the second spacer structure 42B can be the same as a difference between the first width w1 and the second width w2.

Figure 8A:
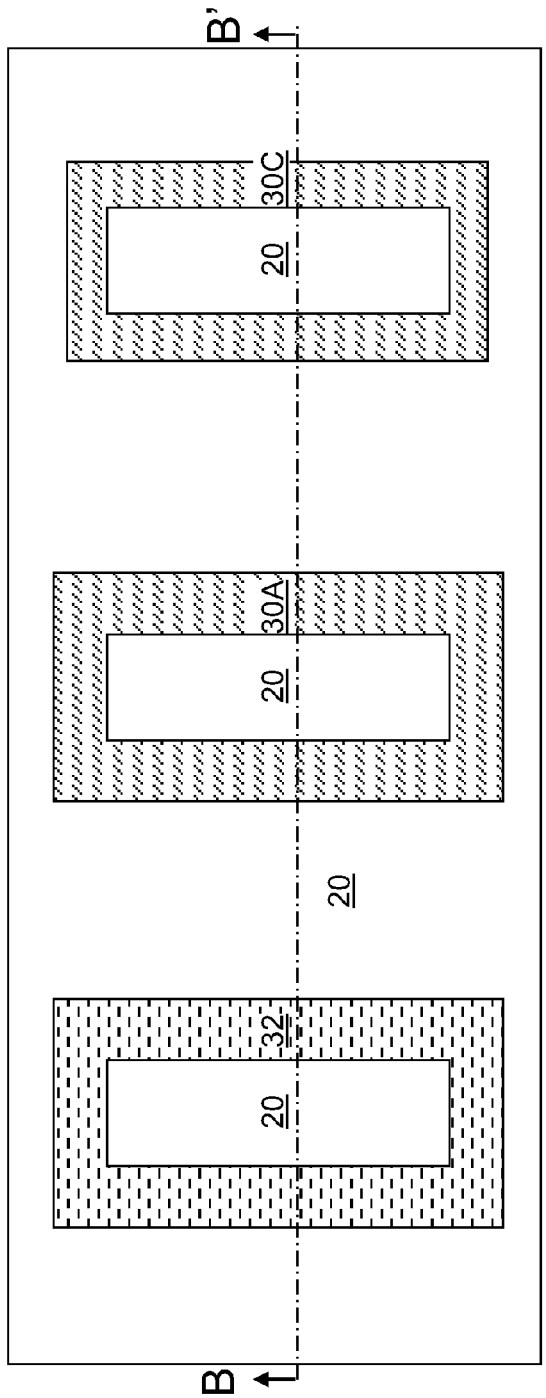
FIG. 8A is a top-down view of the first exemplary semiconductor structure after removal of the spacer structures and recessing of dielectric cap portions according to an embodiment of the present disclosure.
Figure 8B:
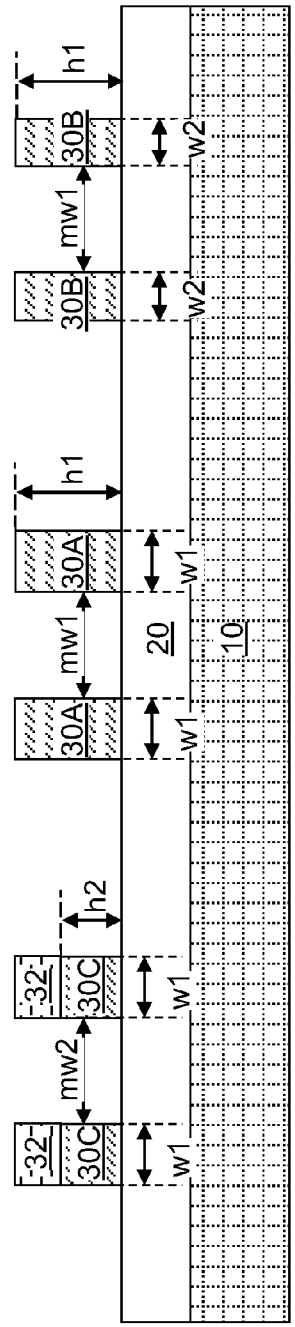
FIG. 8B is a vertical cross-sectional view of the first exemplary semiconductor structure along the vertical plane B-B' of FIG. 8A.

Referring to FIGS. 8A and 8B, the various spacer structures (42A, 42B, 42C) are removed, for example, by an isotropic etch such as a wet etch selectively to the semiconductor material of the semiconductor fins (30A, 30B, 30C) and to the dielectric material of the buried insulator layer 20. For example, if the various spacer structures (42A, 42B, 42C) include silicon nitride or a dielectric metal oxide, and if the buried insulator layer 20 includes silicon oxide, the various spacer structures (42A, 42B, 42C) can be etched employing an etch chemistry that is selective to silicon oxide.

Optionally, the first dielectric cap portion 32A, the second dielectric cap portion 32B, and the dielectric cap portion 32 can be recessed, for example, by an anisotropic etch or by an isotropic etch. If the buried insulator layer 20 includes the same material as the first dielectric cap portion 32A, the second dielectric cap portion 32B, and the dielectric cap portion 32, physically exposed portions of the buried insulator layer 20 may be vertically recessed. If the buried insulator layer 20 includes a different material than the first dielectric cap portion 32A, the second dielectric cap portion 32B, and the dielectric cap portion 32, the first dielectric cap portion 32A, the second dielectric cap portion 32B, and the dielectric cap portion 32 can be recessed selective to the buried insulator layer 20.

In one embodiment, the entirety of the first dielectric cap portion 32A and the entirety of the second dielectric cap portion 32B may be removed by the recess process, and a portion of the dielectric cap portion 32 may remain on top of the third semiconductor fin 30C after the recess process.

The first semiconductor fin 30A has a first height h1 and the first width w1. The second semiconductor fin 30B has the first height h1 and has the second width w2. The third stack (30C, 32) is a vertical stack of the third semiconductor fin 30C and the dielectric cap portion 30. The third semiconductor fin 30C has a second height h2 that is less than the first height h1.

Figure 9A:
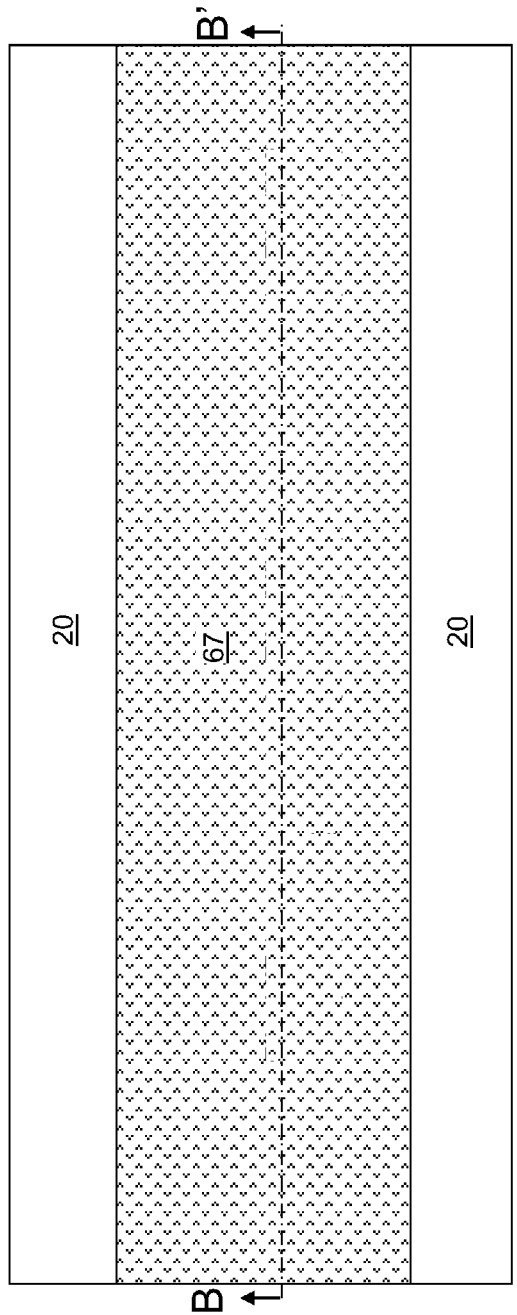
FIG. 9A is a top-down view of the first exemplary semiconductor structure after patterning the semiconductor fins according to an embodiment of the present disclosure.
Figure 9B:
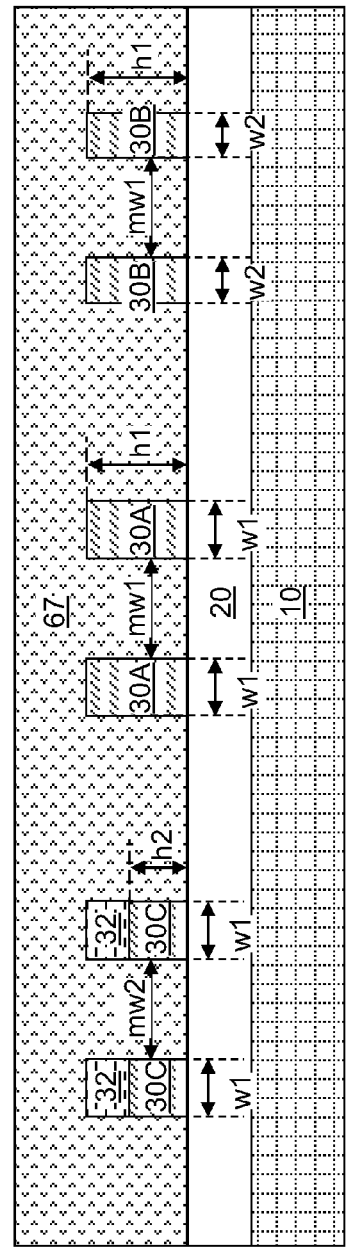
FIG. 9B is a vertical cross-sectional view of the first exemplary semiconductor structure along the vertical plane B-B' of FIG. 9A.

Referring to FIGS. 9A and 9B, a photoresist layer 67 can be optionally applied over the first semiconductor fin 30A, the second semiconductor fin 30B, and the third stack (30C, 32), and is lithographically patterned to cover parallel portions of the first semiconductor fin 30A, the second semiconductor fin 30B, and the third stack (30C, 32), while physically exposing end portions of the first semiconductor fin 30A, the second semiconductor fin 30B, and the third stack (30C, 32). An etch can be employed to remove the physically exposed portions of the first semiconductor fin 30A, the second semiconductor fin 30B, and the third stack (30C, 32).

The remaining portions of the first semiconductor fin 30A can be in the form of two disjoined semiconductor fins that are laterally spaced from each other. The remaining portions of the second semiconductor fin 30B can also be in the form of two disjoined semiconductor fins that are laterally spaced from each other. Likewise, the remaining portions of the third stack (30C, 32) can be in the form of two disjoined stacks of a semiconductor fin and a dielectric cap portion that are laterally spaced from each other. The etch process that divides a semiconductor fin or a stack of a semiconductor fin and a dielectric cap portion into a plurality of semiconductor fins or a plurality of stacks of a semiconductor fin and a dielectric cap portion is optional. The photoresist layer 67 is subsequently removed, for example, by ashing.

Thus, it is understood herein that a reference to the first semiconductor fin 30A encompasses a first semiconductor fin 30A as a single contiguous structure (formed by not employing the etch that divides the first semiconductor fin 30A) or as a plurality of disjoined structures (formed by dividing the first semiconductor fin 30A by an etch). Further, it is understood herein that a reference to the second semiconductor fin 30B encompasses a second semiconductor fin 30B as a single contiguous structure (formed by not employing the etch that divides the second semiconductor fin 30B) or as a plurality of disjoined structures (formed by dividing the second semiconductor fin 30B by an etch). Likewise, it is understood herein that a reference to the third stack (30C, 32) encompasses a third stack (30C, 32) as a single contiguous stack (formed by not employing the etch that divides the third stack) or as a plurality of disjoined stacks (formed by dividing the third stack by an etch).

Referring to FIGS. 10A and 10B, a gate dielectric 50, a gate electrode 52, and a gate cap dielectric portion 54 can be formed over portions of the first semiconductor fin 30A, portions of the second semiconductor fin 30B, and the third stack (30C, 32). For example, a stack of a gate dielectric layer, a gate electrode layer, and a gate cap dielectric layer can be sequentially formed employing methods known in the art, and patterned employing lithographic methods and at least one pattern transfer etch process to form the gate dielectric 50, the gate electrode 52, and the gate cap dielectric portion 54. While the gate dielectric 50, the gate electrode 52, and the gate cap dielectric portion 54 are illustrated as contiguous structures, embodiments are contemplated in which one or more of the gate dielectric 50, the gate electrode 52, and the gate cap dielectric portion 54 are formed as a plurality of physically disjoined structures, i.e., structures having multiple portions that do not contact one another.

Referring to FIGS. 11A and 11B, source regions and drain regions of field effect transistors and at least one gate spacer 56 can be formed. For example, the at least one gate spacer 56 can be formed on sidewalls of the stack of the gate dielectric 50, the gate electrode 52, and the gate cap dielectric portion 54 by conformally depositing a dielectric material layer and anisotropic ally etching horizontal portions of the dielectric material layer. The remaining portions of the conformally deposited dielectric material layer constitute the at least one gate spacer 56. The source regions and the drain regions can be formed by implanting p-type dopants or n-type dopants into portions of the various semiconductor fins (30A, 30B, 30C) that do not underlie the gate electrode 52 or the at least one gate spacer 56. Masked ion implantation steps can be employed to implant the p-type dopants or the n-type dopants to the various semiconductor fins (30A, 30B, 30C). Optionally, source extension regions and drain extension region can be optionally formed by implanting p-type dopants or n-type dopants prior to formation of the at least one gate spacer 56.

A first source region 34A, a first drain region 36A, and a first body region 33A of a first field effect transistor can be formed within the first semiconductor fin 30A. A second source region 34B, a second drain region 36B, and a second body region 33B of a second field effect transistor can be formed within the second semiconductor fin 30B. A third source region 34C, a third drain region 36C, and a third body region 33C of a third field effect transistor can be formed within the third semiconductor fin 30C.

Referring to FIGS. 12A and 12B, various metal semiconductor alloy portions can be optionally formed, for example, by depositing a metal layer, reacting the metal layer with underlying semiconductor materials of the various source regions (34A, 34B, 34C) and the various drain regions (36A, 36B, 36C), and removing unreacted portions of the metal layer. If the various source regions (34A, 34B, 34C) and the various drain regions (36A, 36B, 36C) include silicon, the various metal semiconductor alloy portions can include a metal silicide. The various metal semiconductor alloy portions can include, for example, a first source-side metal semiconductor alloy portion 44A, a second source-side metal semiconductor alloy portion 44B, a third source-side metal semiconductor alloy portion 44C, a first drain-side metal semiconductor alloy portion 46A, a second drain-side metal semiconductor alloy portion 46B, and a third drain-side metal semiconductor alloy portion 46C.

Figure 13A:
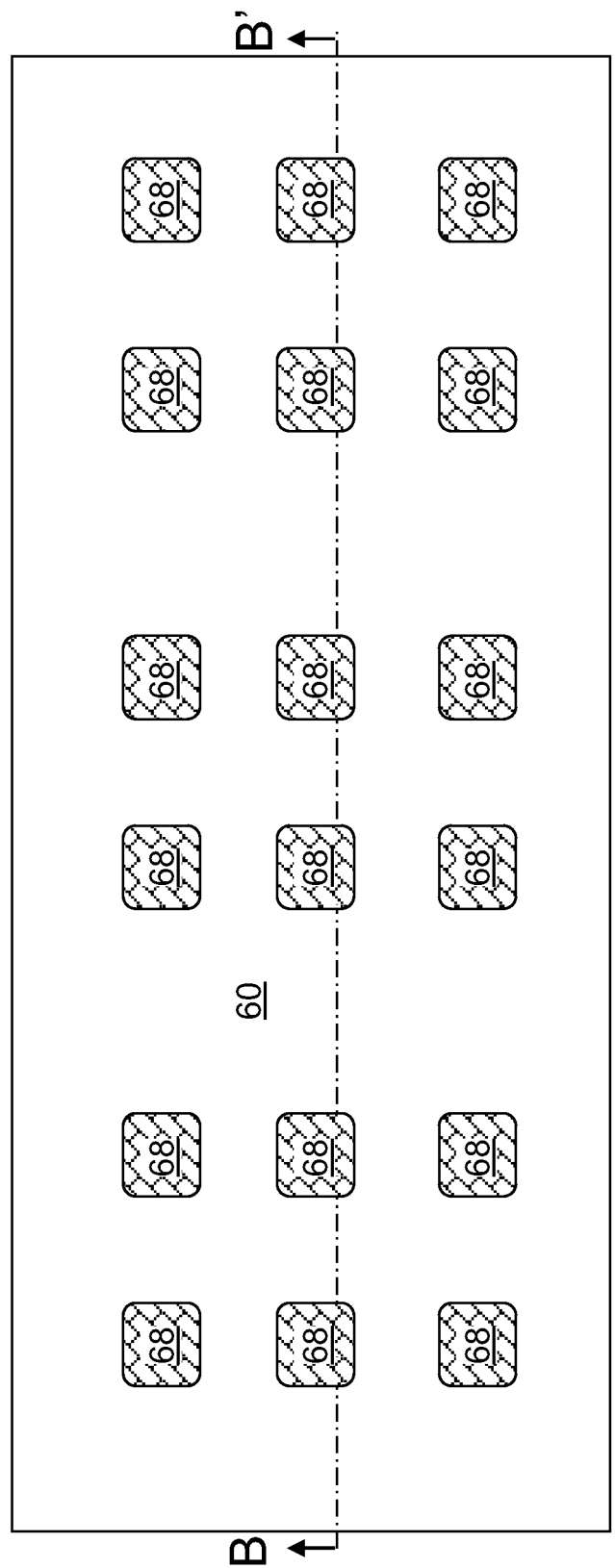
FIG. 13A is a top-down view of the first exemplary semiconductor structure after formation of a contact level dielectric layer and contact via structures according to an embodiment of the present disclosure.
Figure 13B:
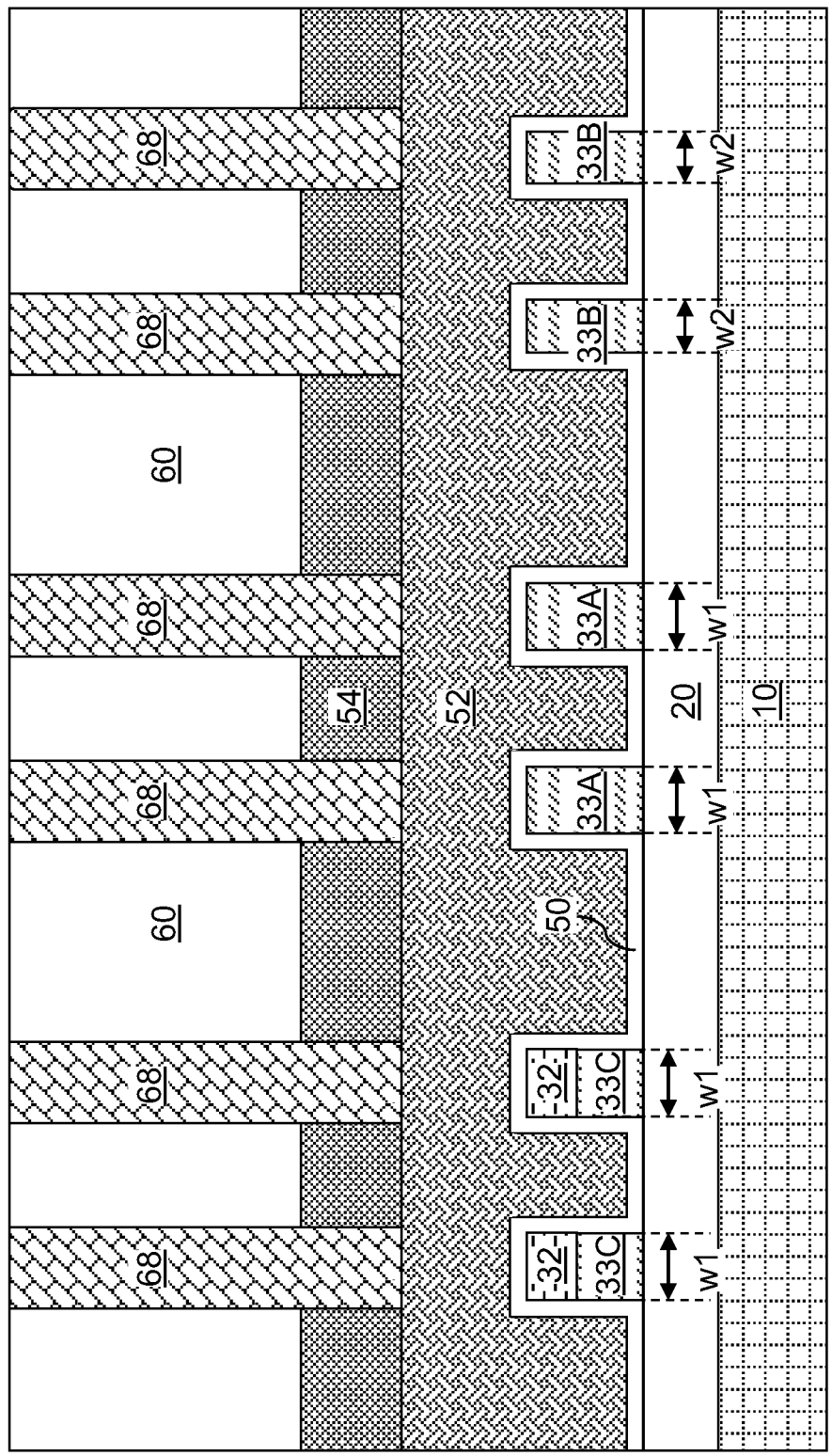
FIG. 13B is a vertical cross-sectional view of the first exemplary semiconductor structure along the vertical plane B-B' of FIG. 13A.

Referring to FIGS. 13A and 13B, a contact-level dielectric layer 60 is deposited and planarized over the first, second, and third field effect transistors, which are fin field effect transistors. The contact-level dielectric layer 60 can include, for example, undoped silicate glass, doped silicate glass, silicon nitride, silicon oxynitride, porous or non-porous organosilicate glass (OSG), or a combination thereof. Various contact via structures 68 can be subsequently formed to provide electrical contact to the various source regions (34A, 34B, 34C), the various drain regions (36A, 36B, 36C), and the gate electrode(s) 52 (which may be a single contiguous structure or may be a plurality of disjoined structures that are electrically isolated from one another).

The ability to continuously scale the recess depth of the recess cavity 31 in combination with the ability to continuously scale the difference between the first width w1 and the second width w2 provides the first exemplary semiconductor structure the ability to continuously scale the on-current of each of the fin field effect transistors. The ability to continuously scale the on-current of each of the fin field effect transistors can be advantageously employed to form circuits in which the rations of on-currents among a plurality of fin field effect transistors can be non-integer numbers. For example, the ability to continuously scale the on-current of each of the fin field effect transistors can be employed to provide a static random access (SRAM) circuit having optimal values for design parameters related to on-currents of field effect transistors (such as "beta" and "gamma" as known in the art).

Figure 14:
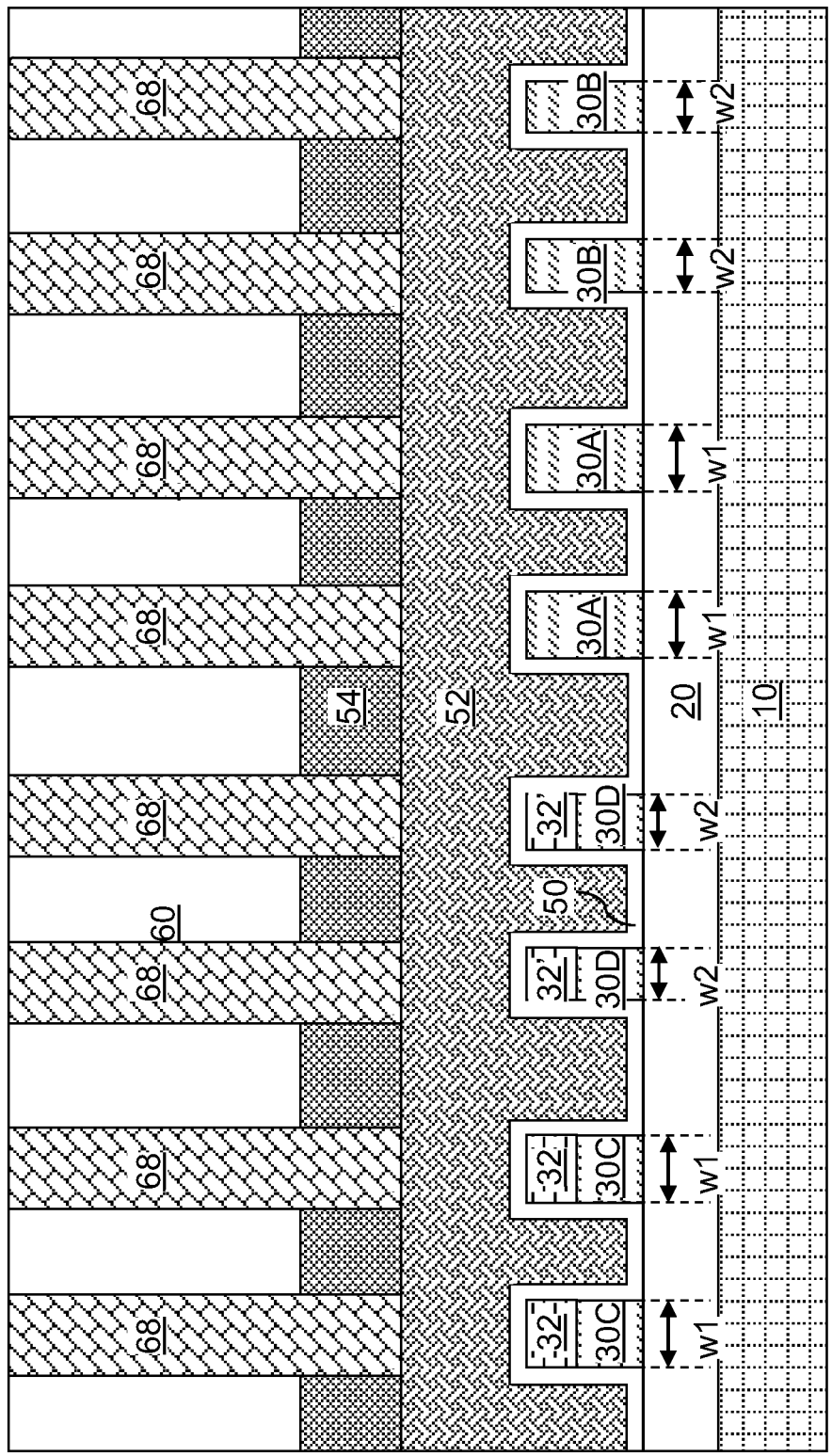
FIG. 14 is a vertical cross-sectional view of a second exemplary semiconductor structure according to an embodiment of the present disclosure.

Referring to FIG. 14, a second exemplary semiconductor structure according to an embodiment of the present disclosure can include an additional type of a stack structure, which includes a third stack (30C, 32) of a third semiconductor fin 30C and a dielectric cap portion 32 and a fourth stack (30D, 32') of a fourth semiconductor fin 30D and another dielectric cap portion 32'.

The fourth stack (30D, 32') can be formed, for example, by forming a fourth disposable mandrel structure (not shown) over a recessed portion of the top semiconductor layer 30L at the processing steps of FIGS. 2A and 2B, by forming a fourth spacer structure on sidewalls of the fourth disposable mandrel structure at the processing steps of FIGS. 3A and 3B, by implanting the at least one dopant material into the fourth spacer structure as well as the second spacer structure 42B at the processing steps of FIGS. 4A and 4B, and by subsequently performing the processing steps of FIGS. 5A and 5B, 6A and 6B, 7A and 7B, 8A and 8B, 9A and 9B, 10A and 10B, 11A and 11B, 12A and 12B, and 13A and 13B.

The fourth semiconductor fin 30D has the same height as the third semiconductor fin 30C, i.e., the second height h2 (See FIG. 9B), and has the same width as the second semiconductor fin 30B, i.e., the second width w2 (See FIG. 9B). Further, the dielectric cap portion 32' has the same width as the fourth semiconductor fin 30D, i.e., the second width w2.

The additional flexibility provided by the combination of the second height h2 and the second width w2 for the dimensions of the fourth semiconductor fin 30D can be advantageously employed to form another fin field effect transistor having non-integer multiple on-current of on-currents provided by other fin field effect transistors employing the first, second, and third semiconductor fins (30A, 30B, 30C).

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    providing a stack of a buried insulator layer and a semiconductor material layer;
    recessing a portion of said semiconductor material layer;
    depositing and planarizing a dielectric cap layer over said recessed portion of said semiconductor material layer and over an unrecessed portion of said semiconductor material layer;
    forming at least a first disposable mandrel structure and a second disposable mandrel structure over said stack and said dielectric cap layer;
    forming a first spacer structure comprising a spacer material around said first disposable mandrel structure and a second spacer structure comprising said spacer material around said second disposable mandrel structure;
    implanting at least one dopant material into said second spacer structure to convert said spacer material into a doped spacer material within said second spacer structure while not implanting said at least one dopant material into said first spacer structure;
    etching physically exposed portions of said first spacer structure and said second spacer structure employing an etch chemistry that provides a greater etch rate for said doped spacer material than said spacer material;
    removing said first and second disposable mandrel structures; and
    forming at least a first semiconductor fin and a second semiconductor fin by transferring a pattern of remaining portions of said first spacer structure and said second structure after said etching into said semiconductor material layer by an etch.

2. The method of claim 1, wherein said spacer material is a dielectric material selected from silicon nitride, silicon oxide, and silicon oxynitride.

3. The method of claim 1, wherein said spacer material is silicon nitride, and said at least one dopant material includes at least one of P, As, Sb, B, Ar, Xe, Ge, Si, and C.

4. The method of claim 1, wherein said forming of said first and second spacer structures comprises:
    depositing a continuous layer of said spacer material; and
    removing horizontal portions of said continuous layer by an anisotropic etch, wherein remaining portions of said continuous layer constitute said first and second spacer structures.

5. The method of claim 1, further comprising forming a patterned implantation mask layer over said first spacer structure while physically exposing said second spacer structure prior to said implanting of said at least one dopant material.

6. The method of claim 1, wherein said first spacer structure and said second spacer structure have a same width upon formation on said first and second disposable mandrel structures, and have different widths after said etching of said physically exposed portions of said first spacer structure and said second spacer structure.

7. The method of claim 1, wherein said first semiconductor fin is formed with a first width, and said second semiconductor fin is formed with a second width that is less than said first width.

8. The method of claim 1, further comprising forming a third semiconductor fin by transferring a pattern of another spacer structure overlying said recessed portion of said semiconductor material layer into said recessed portion of said semiconductor material layer by an anisotropic etch.

9. The method of claim 1, further comprising:
    forming a first source region, a first drain region, and a first body region of a first field effect transistor within said first semiconductor fin; and
    forming a second source region, a second drain region, and a second body region of a second field effect transistor within said second semiconductor fin.

\* \* \* \* \*